United States Patent
Wilk

(10) Patent No.: US 6,734,068 B2
(45) Date of Patent: May 11, 2004

(54) METHOD TO FORM SILICATES AS HIGH DIELECTRIC CONSTANT MATERIALS

(75) Inventor: Glen D. Wilk, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/851,318

(22) Filed: May 9, 2001

(65) Prior Publication Data

US 2001/0021589 A1 Sep. 13, 2001

Related U.S. Application Data

(62) Division of application No. 09/436,895, filed on Nov. 9, 1999, now Pat. No. 6,291,283.
(60) Provisional application No. 60/107,867, filed on Nov. 9, 1998.

(51) Int. Cl.$^7$ .............................................. H01L 31/336
(52) U.S. Cl. ......................... 438/287; 438/3; 438/197; 438/216; 438/240; 438/591; 438/785
(58) Field of Search ............................ 438/3, 197, 216, 438/239, 240, 253, 261, 263, 264, 287, 396, 585, 591, 784, 785

(56) References Cited

U.S. PATENT DOCUMENTS

| 3,551,196 A | * | 12/1970 | Herczog et al. ............. 257/751 |
| 4,432,035 A | * | 2/1984 | Hsieh et al. ................. 361/322 |
| 4,495,219 A | | 1/1985 | Kato et al. .................... 427/82 |
| 5,744,374 A | | 4/1998 | Moon .......................... 437/60 |
| 6,023,124 A | | 2/2000 | Chuman et al. ............. 313/310 |
| 6,023,125 A | | 2/2000 | Yoshikawa et al. ......... 313/310 |
| 6,066,922 A | | 5/2000 | Iwasaki et al. ........... 315/169.3 |
| 6,086,990 A | | 7/2000 | Sumino et al. .............. 428/336 |
| 6,110,784 A | | 8/2000 | Gardner et al. ............. 438/287 |
| 6,127,199 A | | 10/2000 | Inoue et al. .................. 438/30 |
| 6,130,503 A | | 10/2000 | Negishi et al. ............. 313/495 |
| 6,144,155 A | | 11/2000 | Yoshikawa et al. ......... 313/495 |
| 6,147,443 A | | 11/2000 | Yoshikawa et al. ......... 313/306 |
| 6,156,672 A | | 12/2000 | Koshido et al. ............. 438/778 |
| 6,168,958 B1 | | 1/2001 | Gardner et al. ................ 438/3 |

* cited by examiner

Primary Examiner—Jack Chen
(74) Attorney, Agent, or Firm—Wade James Brady, III; Frederick J. Telecky, Jr.

(57) ABSTRACT

An embodiment of the instant invention is a method of forming a semiconductor device situated over a semiconductor substrate, the method comprising the steps of: forming a layer of suboxide material (layer 206 of FIG. 2a) over the substrate (substrate 202 of FIGS. 2a–2c), the suboxide material comprised of a material selected from the group consisting of: $HfSiO_x$, $ZrSiO_x$, $LaSiO_x$, $YSiO_x$, $ScSiO_x$, and $CeSiO_x$; and forming a structure (layer 210 of FIG. 2c) on the layer of suboxide material. In an alternative embodiment, semiconductor device is a transistor where and the structure formed on the layer of suboxide material is a gate electrode (preferably comprised of: polycrystalline silicon, tungsten, titanium, tungsten nitride, titanium nitride, platinum, aluminum, and any combination thereof. In another alternative embodiment, the semiconductor device is a storage device where a bottom electrode is formed under and abutting the suboxide material which forms the dielectric to the storage device and the structure formed on the layer of suboxide material is the top electrode of the storage device.

4 Claims, 1 Drawing Sheet

METHOD TO FORM SILICATES AS HIGH DIELECTRIC CONSTANT MATERIALS

CROSS-REFERENCE TO RELATED PATENT/PATENT APPLICATIONS

This application is a division of Ser. No. 09/436,895, filed Nov. 9, 1999 now U.S. Pat. No. 6,291,283 which claims priority under 35 U.S.C. 119(e)(1) based upon provisional application Serial No. 60/107,867, filed Nov. 9, 1998.

The following commonly assigned patent/patent applications are hereby incorporated by reference:

| U.S. Pat. No. /Ser. No. | Provisional Ser. No. | Provisional Filing Date |
| --- | --- | --- |
| 09/116,138 | 60/053,661 | Jul. 24, 1997 |
| 09/396,289 | 60/100,631 | Sep. 16, 1998 |
| 08/957,503 | 60/029,215 | Oct. 28, 1996 |
| 09/396,642 | 60/100,605 | Sep. 16, 1998 |

FIELD OF THE INVENTION

The instant invention pertains to semiconductor device fabrication and processing and more specifically to a method of fabricating a higher dielectric constant material using a silicate.

BACKGROUND OF THE INVENTION

The trend in semiconductor device processing is to make the devices smaller so that more devices can be fabricated in a given area. This scale down affects substantially all of the device, so that each feature is scaled down. This is particularly problematic for the gate structure and capacitors, because capacitance is proportional to the dielectric constant of the material situated between the two plates of the capacitor and effective area of the dielectric material. In addition, the capacitance of a structure is inversely proportional to the distance between the two electrodes of the structure. Currently, since $SiO_2$ is the material of choice for gate dielectrics, the thickness of this layer is decreased to compensate for the scaling down of the area of the capacitor. However, this thinning of the oxide layer is becoming problematic for a couple of reasons. First, as the thickness of the silicon dioxide layer is decreased to below about 3 nm, the leakage through the oxide becomes unacceptably high. In addition, the oxide layer ceases to act as an effective barrier with regards to keeping dopants which are implanted into the gate electrode to increase the conductivity of the gate electrode out of the channel regions. Second, extremely thin layers, unless they are formed from a process which is self-limiting, are very difficult to reproducibly fabricate. Third, any etching away of a thin layer, especially a gate insulator, using subsequent processing to etch other structures affects the thinner layer more dramatically than it would a thicker layer because a greater percentage of the thinner layer is removed than that of a thicker layer.

Another approach to solve this problem involves changing the gate insulating material to one with a higher dielectric constant. For example, BST, PZT, $TiO_2$ and $Ta_2O_5$ are being considered for the next generation of gate dielectrics. However, each of these materials pose problems because the processing required to make these materials into effective gate dielectric materials conflicts with the processing of standard transistor structures. More specifically, each of these materials require a high temperature anneal in an oxygen-containing ambient, and this anneal can greatly degrade the underlying substrate and any other exposed oxidizable structures.

Hence a new material needs to be used which is relatively easy to process using standard gate structure processing techniques and which has a dielectric constant higher than that of silicon dioxide ($\epsilon \approx 3.9$).

SUMMARY OF THE INVENTION

Basically, the instant invention involves a gate structure which includes an oxide or a silicate layer as the gate dielectric and a method for fabricating such a structure. More specifically, the gate insulator of the instant invention is preferably comprised of $ZrO_2$, $ZrSiO_4$, $HfO_2$, or $HfSiO_4$. Preferably, this layer has a dielectric constant of around 10 to 40 (more preferably around 15 to 30). In alternative embodiments, the dielectric layer of the instant invention can be utilized as a capacitor dielectric.

An embodiment of the instant invention is a method of forming a semiconductor device situated over a semiconductor substrate, the method comprising the steps of: forming a layer of suboxide material over the substrate, the suboxide material comprised of a material selected from the group consisting of: $HfSiO_x$, $ZrSiO_x$, $LaSiO_x$, $YSiO_x$, $ScSiO_x$, and $CeSiO_x$; and forming a structure on the layer of suboxide material. In an alternative embodiment, semiconductor device is a transistor where and the structure formed on the layer of suboxide material is a gate electrode (preferably comprised of: polycrystalline silicon, tungsten, titanium, tungsten nitride, titanium nitride, platinum, aluminum, and any combination thereof). In another alternative embodiment, the semiconductor device is a storage device where a bottom electrode is formed under and abutting the suboxide material which forms the dielectric to the storage device and the structure formed on the layer of suboxide material is the top electrode of the storage device.

The method of the instant invention may also include the step of: subjecting the semiconductor device to an elevated temperature in an ambient which contains oxygen after the step of forming a layer of suboxide material over the substrate and prior to the step of forming a structure on the layer of suboxide material. Preferably, the elevated temperature is around 400 to 600° C. Alternatively, the method of the instant invention may include the step of: subjecting the semiconductor device to an elevated temperature in an ambient which contains ozone after the step of forming a layer of suboxide material over the substrate and prior to the step of forming a structure on the layer of suboxide material. Preferably, the elevated temperature is around 25 to 400° C. In yet another alternative embodiment, the method of the instant invention may include the step of: subjecting the semiconductor device to an elevated temperature in an ambient which contains nitrogen after the step of forming a layer of suboxide material over the substrate and prior to the step of forming a structure on the layer of suboxide material. Preferably, the elevated temperature is around 500 to 600° C.

Another embodiment of the instant invention is a method of fabricating an insulating layer situated between a conductive gate structure and a semiconductor substrate, the method comprising the steps of: forming a layer of $HfSiO_x$ on the semiconductor substrate; subjecting the layer of $HfSiO_x$ to an elevated temperature in an ambient comprised of a gas consisting of: $O_2$, $O_3$, $N_2$, and any combination thereof; and forming the conductive gate structure on the layer of $HfSiO_x$. The step of subjecting the layer of $HfSiO_x$ to an elevated temperature in an ambient comprised of either $O_2$ or $O_3$ may result in the increased oxygen content of the $HfSiO_x$ layer. Preferably, the layer of $HfSiO_x$ is formed by PVD, CVD, or e-beam evaporation using one or more solid targets.

Another embodiment of the instant invention is a method of fabricating an insulating layer situated between a conductive gate structure and a semiconductor substrate, the method comprising the steps of: forming a layer of $ZrSiO_x$ on the semiconductor substrate; subjecting the layer of $ZrSiO_x$ to an elevated temperature in an ambient comprised of a gas consisting of: $O_2$, $O_3$, $N_2$, and any combination thereof; and forming the conductive gate structure on the layer of $ZrSiO_x$. The layer of $ZrSiO_x$ to an elevated temperature in an ambient comprised of either $O_2$ or $O_3$ may result in the increased oxygen content of the $ZrSiO_x$ layer. Preferably, the layer of $ZrSiO_x$ is formed by PVD, CVD, or e-beam evaporation using one or more solid targets.

BRIEF DESCRIPTION OF THE DRAWINGS

Like reference numerals in the different figures represent like or similar features. Features illustrated in the figures are not necessarily to scale.

DETAILED DESCRIPTION OF THE DRAWINGS

Figure 1:
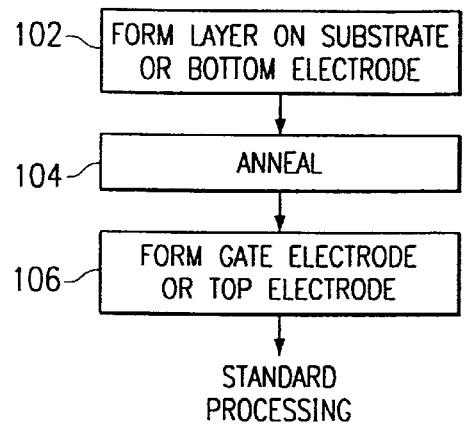
FIG. 1 is a flow diagram illustrating the method of one embodiment of the instant invention.
Figure 2A:
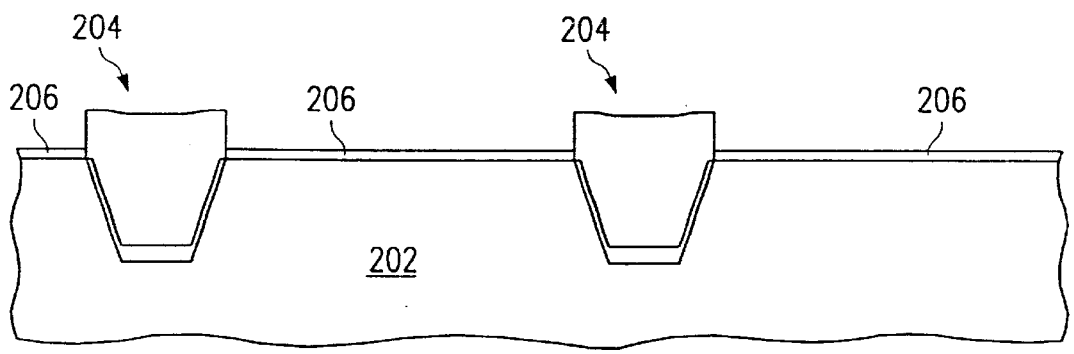
FIGS. 2a–2c are cross-sectional views of a partially fabricated device which is processed using the method of the instant invention as is illustrated in FIG. 1.
Figure 2B:
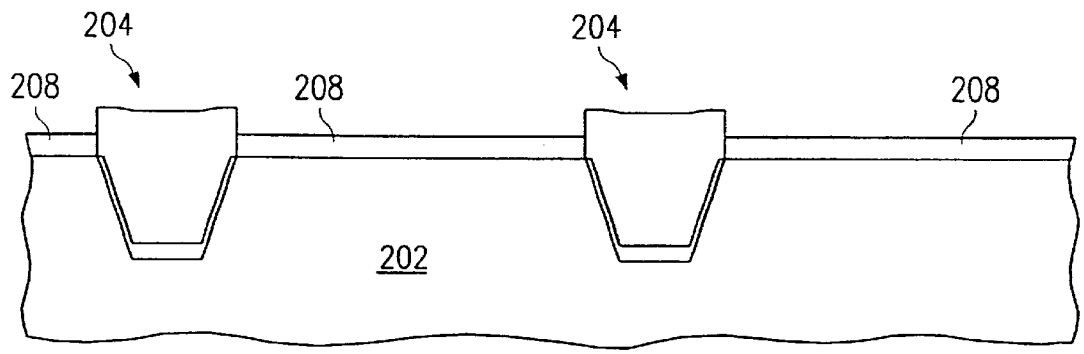
Figure 2C:
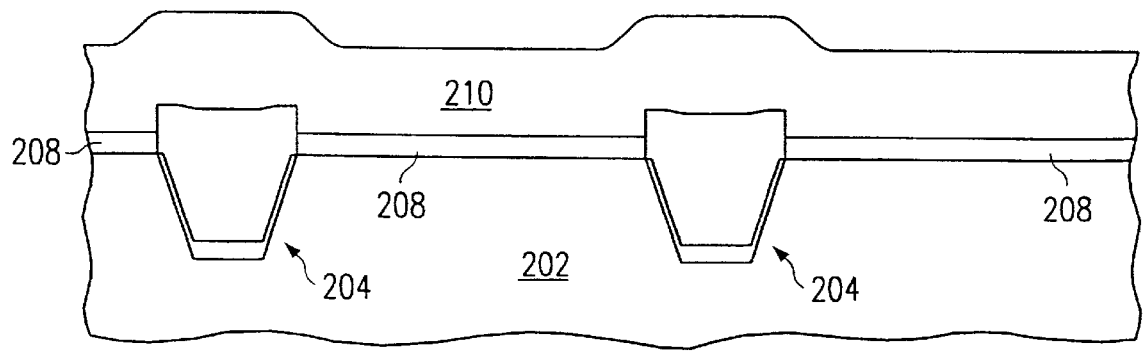

While the following description of the instant invention is centered around the methodology of FIG. 1 and the device structure of FIGS. 2a–2c, the instant invention can be used with a metal gate or any other type of gate structure and it can be fabricated using a disposable gate (as illustrated in the cases incorporated by reference) or using the standard process flow as is shown. The dielectric layer of the instant invention may also be used as the gate dielectric in a disposable gate structure process flow as is illustrated in co-pending U.S. patent application Ser. No. 60/100,605, filed Sep. 16, 1998, which is herein incorporated by reference. In addition, the methodology of the instant invention and the dielectric layer formed, thereby, can be used as the dielectric between electrodes of a capacitor.

Prior processing may be performed prior to the method of the instant invention. This prior processing may include cleaning the surface of the wafer 202, formation of isolation areas 204, and doping of portions of the wafer. Isolation structures 204 are illustrated in FIGS. 2a–c as shallow trench isolation structures (STI) but any type of isolation structure may be used. Examples of isolation structures include, LOCOS, STI, and junction isolation structures.

In most standard processing regimes a thin oxide is grown on the wafer prior to the formation of the isolation structure and implanting of the substrate dopants. If a thin oxide layer is used it would, preferably, be removed prior to step 102. Preferably, the removal of the thin oxide layer is accomplished in an oxide etch, or deglaze, step. This process will, preferably, include subjecting the wafer to an HF solution so as to remove the protective oxide while not substantially affecting isolation structure 204.

Referring to step 102 of FIG. 1 and FIG. 2a, a layer 206 is blanketly formed over substrate 202. In step 102, layer 206 may not be formed on isolation structure (shown in FIG. 2a), preferably by a masking operation, it may be selectively removed from isolation structure 204, or it may be formed on isolation structure 204 (not shown) and left there. Preferably, layer 206 will be comprised of a transition metal (such as Hf, Zr, La, Y, Sc, and/or Ce), silicon (if layer 208 is to be a silicate) and potentially oxygen and/or nitrogen. Layer 206 may be formed by physical vapor deposition (PVD—also referred to as sputtering) using a target comprised of the transition metal (and silicon if layer 208 is a silicate) or separate targets for the different elements to be added; chemical vapor deposition; or e-beam evaporation using one or more solid targets (comprised of either solely the transition metal, a transition metal oxide, the transition metal and silicon, and/or solely silicon).

If layer 206 is formed using PVD, then the processing conditions are, preferably: total system pressure around 5 mTorr, sputter power of around 200 to 300 Watts (more preferably around 250 Watts), and a substrate temperature around 25 to 600° C. (more preferably around 400 to 600° C. for $HfSi_2$ and around room temperature for $ZrSi_2$). Preferably layer 206 will be comprised of $HfSiO_x$, $ZrSiO_x$, $LaSiO_x$, $YSiO_x$, $ScSiO_x$, $CeSiO_x$, Hf, $HfSi_2$, Zr, $ZrSi_2$, La, $LaSi_x$, Y, $YSi_x$, Sc, $ScSi_x$, Ce, or $CeSi_x$, and is preferably on the order of 4 to 10 nm thick (more preferably around 4 to 6 nm thick). During the PVD process, the ambient of the PVD chamber may be comprised with Ar and $O_2$ or $O_3$ (preferably 50% Ar and 50% $O_2$). If layer 206 is formed using e-beam evaporation, the wafer temperature is preferably around 400 to 600° C. and the process is accomplished in a vacuum.

Referring to step 104 of FIG. 1 and FIG. 2b, an anneal is performed next so as to convert layer 206 into an oxidized (or nitrided) form of the layer which contained the transition metal or into a silicate form of the layer which contained a combination of silicon and the transition metal, or more preferably to fully oxidize (or nitride) the already existing silicate layer. For example, if layer 206 is comprised of Hf, $HfSi_2$, Zr, or $ZrSi_2$ it would become $HfO_x$, $HfSiO_x$, $ZrO_x$, or $ZrSiO_x$, respectively, or more preferably if the layer is already $HfSiO_x$, the anneal step will convert it to a layer with a higher oxygen content by increasing the x value, if the anneal step was in an oxygen or ozone ambient. Preferably, anneal step 104 is either performed: in an $O_2$ ambient at a temperature around 400 to 600° C.; in an $O_3$ ambient at a temperature around 25 to 400° C.; or in an $N_2$ ambient at a temperature around 500 to 600° C. Other temperature and ambient combinations may be used but these seem to give the best results. Preferably, layer 206 is subjected to this elevated temperature in an oxygen-containing and/or nitrogen-containing atmosphere for a period of between 10 and 120 minute (more preferably around 20 to 45 minutes—even more preferably around 30 minutes) in anneal step 104.

A $HfSiO_4$ dielectric layer formed using the method above (steps 102 and 104) will result in a dielectric layer which has a leakage of around $1.5 \times 10^{-6}$ A/cm$^2$ at a supply voltage of around 1.5 volts. This is quite low as compared to a silicon dioxide layer of the same electrical thickness (as determined by electrical techniques such as capacitance-voltage or current-voltage measurements), which has a leakage current of around 1 A/cm$^2$ at around 1.5 volts. A $HfSiO_4$ dielectric layer formed using the method above (which is around 5 nm thick) will be electrically equivalent to a 1 to 2 nm thick silicon dioxide film and it remains stable (with regards to its interface with silicon) to at least 800° C. (and probably even to 1000 or 1100° C.). In addition, the $HfSiO_4$ dielectric layer formed using the method above will remain amorphous at subsequent processing temperature in excess of 800° C. (and probably even to 1000 to 1100° C.).

A $ZrSiO_4$ dielectric layer formed using the method above (steps 102 and 104) will result in a dielectric layer which has a leakage of around $1.3 \times 10^{-5}$ A/cm$^2$ at a supply voltage of around 1.5 volts. A $ZrSiO_4$ dielectric layer formed using the method above (which is around 5 nm thick) will have a dielectric constant equivalent to a 2 nm thick silicon dioxide film and it remains stable (with regards to its interface with silicon) to at least 800° C. (and probably even to 1000 or 1100° C.). In addition, the $ZrSiO_4$ dielectric layer formed using the method above will remain amorphous at subsequent processing temperature in excess of 800° C. (and probably even to 1000 to 1100° C.).

Anneal 104 may be performed in an ambient which contains around 90% $N_2$ and around 10% $H_2$ at around 400 to 500° C. (more preferably around 450° C.), however, the layer will not have the beneficial electrical properties as a layer formed using the anneal step described above. A layer using this method can be improved, though, by subjecting it to a second anneal in an $N_2$ and/or Ar ambient at a temperature around 500 to 600° C. An oxygen ambient may be used, but there is a concern that the hydrogen incorporated into the film from the first anneal may combine with the oxygen in the ambient to form moisture and, thereby, degrade the film or one of the other structures. Hence, it is preferable to use either an inert nitrogen or argon ambient.

Referring to step 106 of FIG. 1 and to FIG. 2c, a conductive gate electrode layer 210 is formed. Preferably, layer 210 is comprised of polycrystalline silicon, doped polycrystalline silicon, tungsten, titanium, tungsten nitride, titanium nitride, platinum, aluminum, a combination thereof or a stack comprised of one or more of the above. Layer 210 is preferably formed using standard semiconductor processing steps and is of a thickness which is commonly used in standard transistor formation.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

I claim:

1. A method of forming a capacitor or transistor gate dielectric disposed over a semiconductor substrate, said method comprising the steps of:

providing a semiconductor substrate;

forming a layer of a composition consisting essentially of a material taken from the class consisting of a suboxides both of a transition metal and silicon over said semiconductor substrate; and forming an electrically conductive structure on said layer spaced from said semiconductor substrate to complete formation of said capacitor.

2. The method of claim 1 further including the step of subjecting said layer to an elevated temperature in an ambient of a gas taken from the group consisting of $O_2$, $O_3$, $N_2$ and any combination thereof.

3. The method of claim 2 wherein said step of subjecting is performed prior to said step of forming an electrically conductive structure on said layer.

4. The method of claim 3 wherein said elevated temperature is from about 400 to about 600 degrees C.

* * * * *